(12) United States Patent
Bharadwaj

(10) Patent No.: US 10,680,161 B1
(45) Date of Patent: Jun. 9, 2020

(54) ELECTRONIC DEVICES WITH PIEZOELECTRIC INK

(71) Applicant: Apple Inc., Cupertino, CA (US)

(72) Inventor: Shravan Bharadwaj, San Jose, CA (US)

(73) Assignee: Apple Inc., Cupertino, CA (US)

( * ) Notice: Subject to any disclaimer, the term of this patent is extended or adjusted under 35 U.S.C. 154(b) by 473 days.

(21) Appl. No.: 15/785,175

(22) Filed: Oct. 16, 2017

Related U.S. Application Data

(60) Provisional application No. 62/478,512, filed on Mar. 29, 2017.

(51) Int. Cl.
| | | |
|---|---|---|
| *H01L 41/09* | (2006.01) | |
| *H01L 41/08* | (2006.01) | |
| *H01L 41/047* | (2006.01) | |
| *H01L 41/18* | (2006.01) | |
| *H03K 17/96* | (2006.01) | |
| *H04R 17/00* | (2006.01) | |
| *H01L 41/317* | (2013.01) | |
| *H01L 41/187* | (2006.01) | |

(52) U.S. Cl.
CPC ...... *H01L 41/0825* (2013.01); *H01L 41/0475* (2013.01); *H01L 41/183* (2013.01); *H01L 41/317* (2013.01); *H03K 17/9643* (2013.01); *H04R 17/00* (2013.01); *H01L 41/1876* (2013.01)

(58) Field of Classification Search
CPC ............. H01L 41/0825; H01L 41/0475; H01L 41/183; H01L 41/317; H01L 41/1876; H03K 17/9643; H04R 17/00

USPC .......................... 310/311, 324, 348, 366–370
See application file for complete search history.

(56) References Cited

U.S. PATENT DOCUMENTS

| | | | |
|---|---|---|---|
| 5,600,197 A | 2/1997 | Takeuchi et al. | |
| 5,639,508 A | 6/1997 | Okawa et al. | |
| 5,889,871 A | 3/1999 | Downs, Jr. | |
| 6,964,201 B2 | 11/2005 | Xu et al. | |
| 2002/0130590 A1* | 9/2002 | Shiraishi | B06B 1/0629 310/334 |
| 2003/0112298 A1 | 6/2003 | Sato et al. | |

(Continued)

FOREIGN PATENT DOCUMENTS

WO WO-2019/139501 A1 * 7/2019 ............. B41M 3/14

*Primary Examiner* — Thomas M Dougherty
(74) *Attorney, Agent, or Firm* — Treyz Law Group, P.C.; Kendall W. Abbasi

(57) ABSTRACT

An electronic device may have input devices and/or output devices based on piezoelectric components. Piezoelectric components may include piezoelectric ink in which particles of piezoelectric material are dispersed in a binder. The piezoelectric ink may be printed or otherwise deposited onto a substrate to form piezoelectric ink traces. The piezoelectric ink traces may be deposited on flexible substrates such as elastic speaker diaphragms or flexible fabric layers. The piezoelectric traces may be part of a key in a keyboard or a stand-alone button. In arrangements where the piezoelectric trace forms part of a key in a keyboard, the piezoelectric trace may be coupled to a grid of horizontal and vertical signal lines. The signal lines may convey key press data from the piezoelectric trace to control circuitry and/or may supply control signals from the control circuitry to the piezoelectric trace to produce haptic output.

20 Claims, 10 Drawing Sheets

(56) References Cited

U.S. PATENT DOCUMENTS

2011/0049579 A1    3/2011  Dumitru et al.
2011/0291525 A1*  12/2011  Maruyama ........... H02N 2/0015
                                                310/334

* cited by examiner

ELECTRONIC DEVICES WITH PIEZOELECTRIC INK

This application claims the benefit of provisional patent application No. 62/478,512, filed Mar. 29, 2017, which is hereby incorporated by reference herein in its entirety.

FIELD

This relates generally to electronic devices and, more particularly, to electronic devices with piezoelectric components.

BACKGROUND

Electronic devices often include input-output devices for gathering input and providing output. Input-output devices are sometimes formed from piezoelectric materials. For example, haptic output devices such as vibrators may use piezoelectric materials.

It can be challenging to incorporate conventional piezoelectric components into an electronic device. For example, it may be difficult to mount piezoelectric ceramic wafers to flexible substrates or to achieve the desired output from the piezoelectric material.

SUMMARY

An electronic device may have input devices and/or output devices based on piezoelectric components. Piezoelectric components may include piezoelectric ink in which particles of piezoelectric material are dispersed in a binder. The piezoelectric particles may be lead zirconate titanate or other suitable piezoelectric material. The binder may be formed from a metal oxide, a polymer material such as silicone, or other suitable material.

The piezoelectric ink may be printed or otherwise deposited onto a substrate to form piezoelectric ink traces. The fluid or paste-like nature of the piezoelectric ink may allow the piezoelectric ink to be deposited on a variety of surfaces including flexible surfaces, curved surfaces, and surfaces with protrusions, recesses, or other surface features.

The piezoelectric ink traces may be deposited on a flexible membrane that forms a diaphragm for a speaker. Control circuitry may apply a voltage to the piezoelectric traces to cause the piezoelectric traces to vibrate the flexible membrane to produce sound.

The piezoelectric traces may be part of a key in a keyboard or a stand-alone button. Control circuitry may supply haptic output from the key using the piezoelectric traces and/or may receive key press data that the piezoelectric traces produce in response to an applied force or touch.

In arrangements where the piezoelectric trace forms part of a key in a keyboard, the piezoelectric trace may be coupled to a grid of horizontal and vertical signal lines. Each trace may have first and second opposing ends coupled to first and second terminals. The first terminal may be coupled to one of the horizontal signal lines and the second terminal may be coupled to one of the vertical signal lines. The signal lines may convey key press data from the piezoelectric trace to control circuitry and/or may supply control signals from the control circuitry to the piezoelectric trace to produce haptic output.

DETAILED DESCRIPTION

Electronic devices may be provided with input-output devices. The input-output devices may include components that gather input from a user such as touch sensors, buttons, force sensors, force-sensitive touch sensors, microphones, and other input gathering components. The input-output devices may also include components that provide output to a user such as speakers that provide audio output and haptic devices that provide haptic output (e.g., tactile output in the form of vibrations that are picked up by a user's fingers).

Input-output devices may include piezoelectric components. The piezoelectric components may include piezoelectric fluid or ink in which piezoelectric particles are dispersed in a binder. The piezoelectric ink may be deposited on a substrate. Illustrative components that may include piezoelectric inks include audio components such as speakers and microphones, buttons, touch sensors, force sensors, ultrasonic sensors, other sensors, ultrasonic motors, other motors, actuators, latches, other components, or components that implement the functionality of two more of these components.

Figure 1:
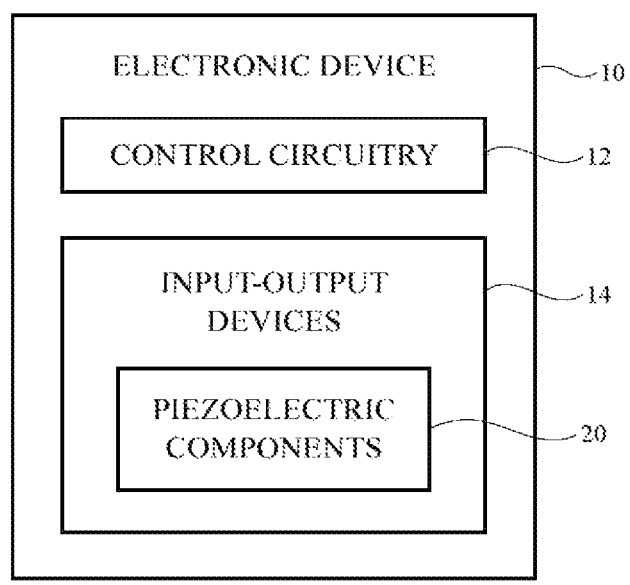
FIG. 1 is a schematic diagram of an illustrative electronic device with piezoelectric components in accordance with an embodiment.

A schematic diagram of an illustrative electronic device of the type that may include piezoelectric components such as piezoelectric components based on piezoelectric ink is shown in FIG. 1. Electronic device 10 of FIG. 1 may be an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic device 10 is mounted in a kiosk, in an automobile, airplane, or other vehicle, other electronic equipment, or equipment that implements the functionality of two or more of these devices. If desired, electronic device 10 may be a removable external case for electronic equipment or other device accessory, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), may be a keyboard, or may be any other suitable device that includes circuitry.

As shown in FIG. 1, electronic device 10 may have control circuitry 12. Control circuitry 12 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 12 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 14 may be used to allow data to be supplied to device 10 and to allow data to be provided from device 10 to external devices. Input-output devices 14 may include buttons, joysticks, scrolling wheels, touch pads, key pads, keyboards, microphones, speakers, tone generators, vibrators, cameras, sensors, light-emitting diodes and other status indicators, displays, data ports, etc. Input-output devices 14 may include piezoelectric components 20 such as components based on piezoelectric materials. Piezoelectric materials exhibit the piezoelectric effect by generating voltages in response to applied force. Piezoelectric materials also exhibit the "reverse" piezoelectric effect by moving in response to an applied electric field. As a result, piezoelectric materials can be used for both sensing and actuation applications. Piezoelectric components 20 may include piezoelectric ink in which particles of piezoelectric material are dispersed in a binder and printed or otherwise deposited on a substrate.

Piezoelectric components 20 may include audio components such as speakers and microphones, buttons, touch sensors, force sensors, ultrasonic sensors, other sensors, ultrasonic motors, other actuators, latches, other components, or components that implement the functionality of two more of these components.

Control circuitry 12 may be used to run software on device 10 such as operating system code and applications. During operation of device 10, the software running on control circuitry 12 may use input-output devices 14 to gather user input (e.g., key press input or other input from a keyboard, button press input from a button on a fabric wrist band or other fabric item, or other input from input-output devices 14) and to supply the user with output using input-output devices 14. Device 10 may, for example, supply a user with output using piezoelectric components 20 (e.g., haptic feedback to inform a user that input on a key in a keyboard, a button on a watch band, or other input device has been received, audio feedback, or other suitable output). Device 10 may also receive input using piezoelectric components 20 (e.g., audio input, touch input, force input, etc.). In some configurations, piezoelectric components 20 may be used for sensing or actuation that is not necessarily related to input from a user or output for a user. For example, piezoelectric components 20 may be used to actuate a latch (e.g., to attach or detach two parts of device 10), may be used as a motor for actuating a lens in a camera, etc. Piezoelectric components 20 may, if desired, be used to provide vibrating alerts (haptic alerts) and other haptic output (i.e., haptic output that is not necessarily directly related to confirming a key press or button press). In general, piezoelectric components 20 be used for forming any suitable actuators and/or sensors.

Figure 2:
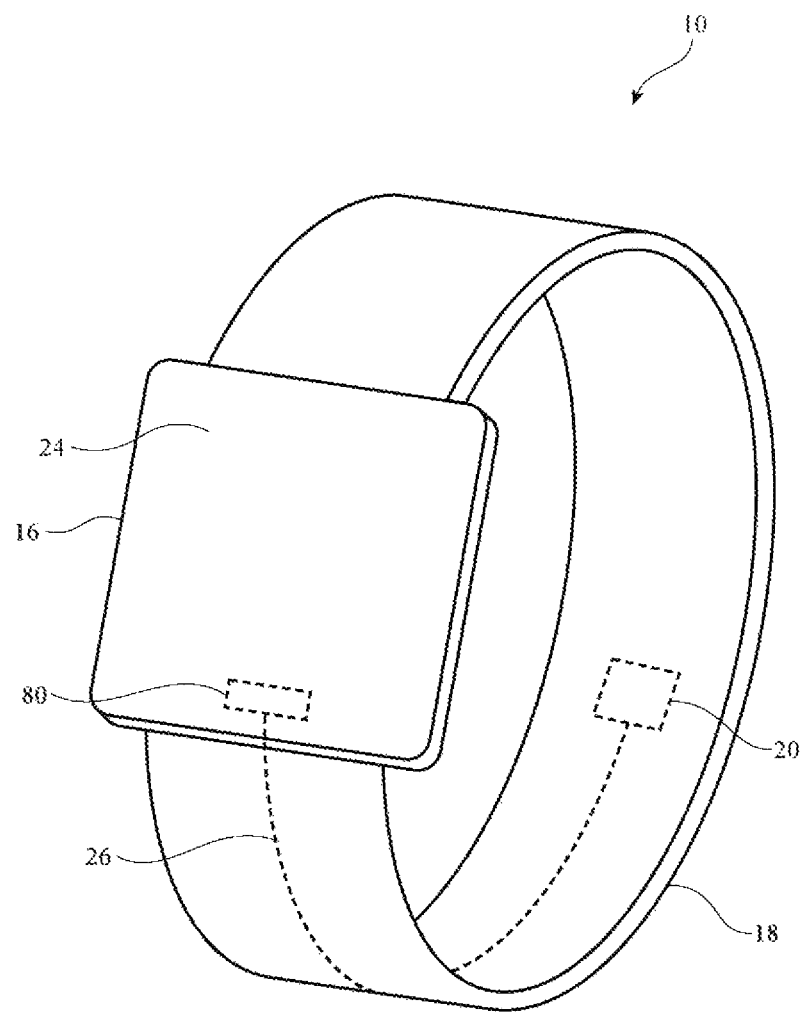
FIG. 2 is a perspective view of an illustrative electronic device with piezoelectric components in accordance with an embodiment.

A perspective view of an illustrative electronic device that may include piezoelectric components is shown in FIG. 2. As shown in FIG. 2, electronic device 10 may include strap 18 and electronic device housing 16. In the illustrative example of FIG. 2, strap 18 is attached to housing 16 and may, for example, be used to attach electronic device 10 to some part of a user's body. For example, strap 18 may form a wrist band, an arm band, a head band, a waist band, or other article that can be secured against a user's body and that can support or hold electronic device 10 in place (e.g., against a user's skin). The arrangement of FIG. 2 is, however, merely illustrative. In general, housing 16 and strap 18 may be integrated with or attached to one another in any suitable fashion.

In the example of FIG. 2, device 10 includes display 24. Display 24 has been mounted in housing 16. Housing 16, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 16 may be formed using a unibody configuration in which some or all of housing 16 is machined or molded as a single structure or may be formed using multiple structures (e.g., an internal frame structure, one or more structures that form exterior housing surfaces, etc.).

Display 24 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 24 may include an array of pixels formed from liquid crystal display (LCD) components, an array of electrophoretic pixels, an array of plasma display pixels, an array of organic light-emitting diode pixels, an array of electrowetting pixels, or pixels based on other display technologies.

In the illustrative example of FIG. 2, piezoelectric component 20 may be formed on or integrated with strap 18. Electrical path 26 may be used to convey signals between piezoelectric component 20 and components in housing 16 such as component 80. Component 80 may, for example, be a voltage source that supplies a voltage to piezoelectric component 20 and/or may be an electrical load that receives electrical current from piezoelectric component 20 over path 26 in response to an applied force on piezoelectric component 20.

Component 80 (e.g., an electrical supply or load) may be mounted in housing 16 of electronic device 10 and may be coupled to path 26 in strap 18. In some arrangements, path 26 and component 80 may be detachable from one another so that strap 18 can be detached from housing 16. In other arrangements, path 26 may be permanently coupled to component 80 in housing 16. The arrangement of FIG. 2 is merely illustrative, however. If desired, component 80 may be mounted to or incorporated into strap 18, or piezoelectric component 20 and path 26 may be mounted in housing 16.

Device 10 may include fabric. Fabric may be used to form a housing structure, part of a strap or band such as band 18 of FIG. 2, a cover for a keyboard, or other structures in device 10. In arrangements of the type shown in FIG. 2, fabric may be used to form all or a portion of strap 18. Fabric may be knitted, braided, woven, or otherwise formed from intertwined fibers. As an example, the fabric for device 10 may include woven fabric such as illustrative woven fabric 74 of FIG. 3.

Figure 3:
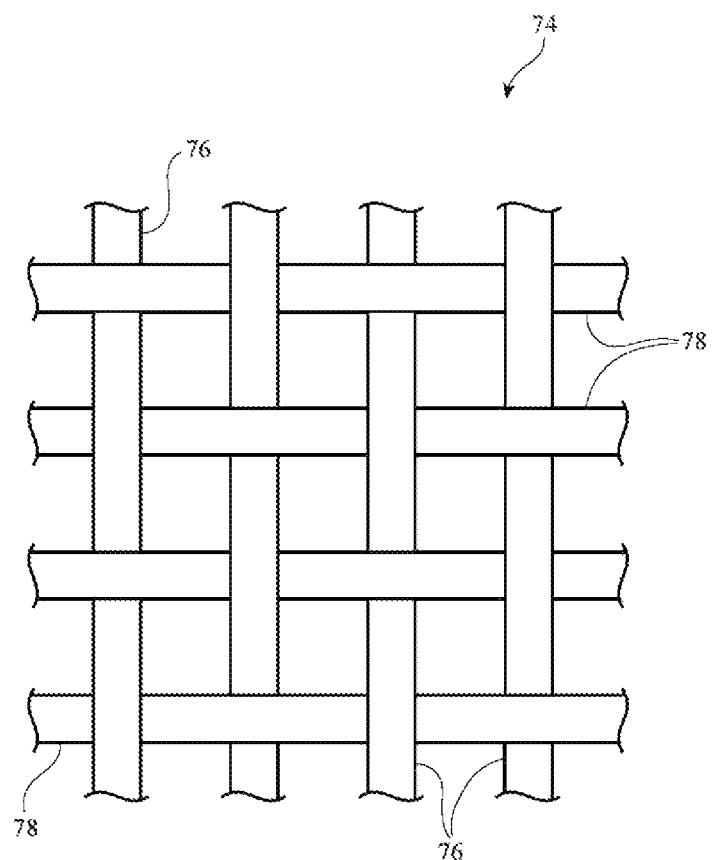
FIG. 3 is a top view of illustrative fabric in accordance with an embodiment.

As shown in FIG. 3, fabric 74 may include strands of material such as warp strands 76 and perpendicular strands of material such as weft strands 78. Fabric 74 may have a plain weave, a basket weave, may be a three-dimensional fabric (e.g., a spacer fabric), or may have other suitable fabric constructions. Strands 76 and 78 may include insulating strands and/or conductive strands. Conductive strands may be formed from metal wires, metal wires coated with polymer, metal coatings on insulating strands of material such as glass or polymer strands, or other suitable conductive structures. Insulating strands may be formed from polymer, other dielectric, multiple dielectric layers, or other suitable insulating structures. Strands of material in fabric 74 may be monofilaments or may be multifilament yarns. Fabric 74 may include exclusively insulating strands, may include exclusively conductive strands, or may include a mixture of insulating and conductive strands. For example, fabric 74 may include insulating strands and conductive strands and the conductive strands may be used in carrying signals associated with input-output devices 14 (e.g., currents for controlling piezoelectric devices 20, sensor signals from piezoelectric devices 20, etc.).

Figure 4:
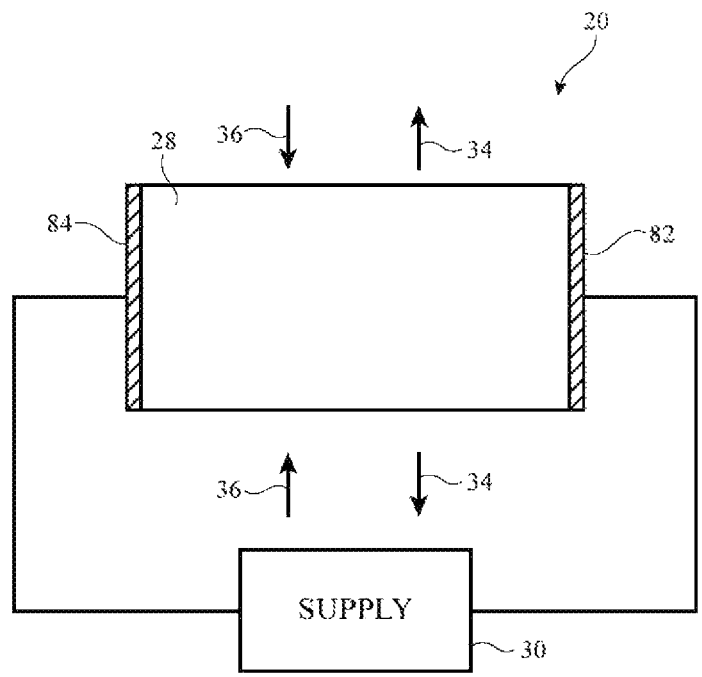
FIG. 4 is a diagram of an illustrative piezoelectric component that converts electrical energy into mechanical energy in accordance with an embodiment.
Figure 5:
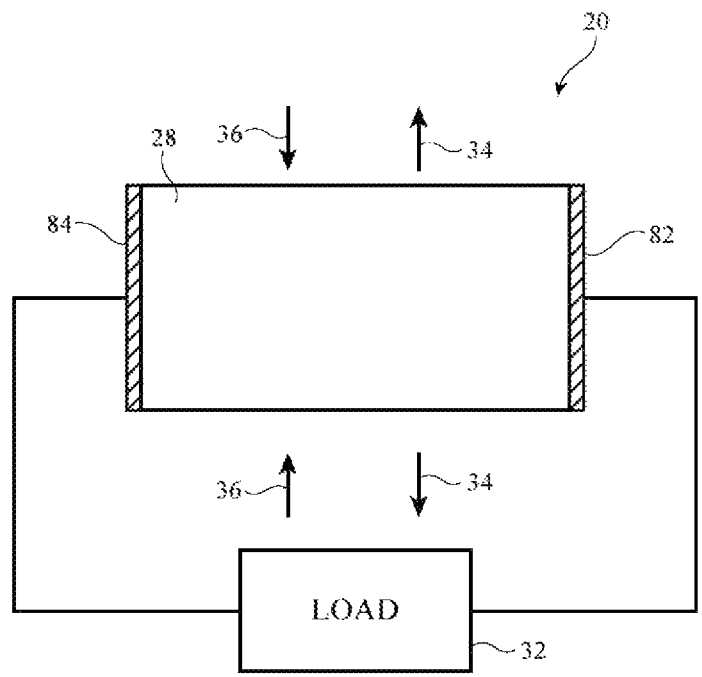
FIG. 5 is a diagram of an illustrative piezoelectric component that converts mechanical energy into electrical energy in accordance with an embodiment.

Diagrams of illustrative piezoelectric components that may be used in electronic device 10 are shown in FIGS. 4 and 5. In the example of FIG. 4, piezoelectric component 20 exhibits the inverse piezoelectric effect to convert electrical energy into mechanical energy. Piezoelectric component 20 may include a piezoelectric material such as piezoelectric material 28. Piezoelectric material 28 may have a net polarization (sometimes referred to as a poling voltage) as a result of being poled (e.g., a process during which piezoelectric material is exposed to a strong magnetic field to align domains, or groups of dipoles, in the material). Examples of materials that may be used to form piezoelectric material 28 include synthetic ceramics such as lead zirconate titanate (PZT), naturally occurring crystals such as quartz, synthetic crystals such as langasite, polymer-based piezoelectric materials such as Polyvinylidene fluoride, lead-free piezoceramics such as sodium potassium niobate, piezoelectric nanotubes such as boron-nitride nanotubes or composite carbon nanotubes, other suitable piezoelectric materials, or a combination of any two or more of these materials. Piezoelectric material 28 may be formed from a single solid piezoelectric substance or may be formed from a piezoelectric fluid or paste in which piezoelectric particles are dispersed in a binder that can be printed or otherwise deposited onto a surface.

An electrical supply such as electrical supply 30 (e.g., a voltage source) may supply a current (e.g., an alternating current or a direct current) to electrodes 82 and 84. The resulting voltage across piezoelectric material 28 causes piezoelectric material 28 to either elongate (as indicated by arrows 34) or compress (as indicated by arrows 36), depending on the polarity of the applied voltage. The mechanical output from piezoelectric material 28 may be proportional to the voltage applied to material 28. When supply 30 applies an alternating current to piezoelectric material 28, piezoelectric material 28 will lengthen and shorten cyclically at the frequency of the applied voltage, resulting in a mechanical vibration. This type of mechanical vibration may be used to form a motor (e.g., an ultrasonic motor or other suitable motor), a sound generating device (e.g., a speaker), a haptic output device (e.g., a vibrator), or other suitable device.

In the example of FIG. 5, piezoelectric component 20 exhibits the piezoelectric effect to convert mechanical energy into electrical energy. When a tension force (as indicated by arrows 34) or a compressive force (as indicated by arrows 36) is applied to piezoelectric material 28, a voltage is generated across piezoelectric material 28, having a polarity that is either the same as or opposite to the poling voltage of piezoelectric material 28, depending on the direction of compression or tension relative to the poling voltage. The resulting voltage across electrodes 82 and 84 may supply a current to an electrical load such as electrical load 32. The electrical signal produced by piezoelectric material 28 may be proportional to the amount of compressive or tension force applied to material 28. In this way, piezoelectric component 20 of FIG. 5 may be used as a sensor (e.g., an ultrasonic sensor, a microphone, a force sensor, a touch sensor, or other suitable sensor).

If desired, the same piezoelectric component may be used to exhibit both the piezoelectric effect and the reverse piezoelectric effect (e.g., may be coupled to both an electrical source and an electrical load). The diagrams of FIGS. 4 and 5 are merely illustrative of the two phenomena that piezoelectric component 20 may be capable of exhibiting.

Figure 6:
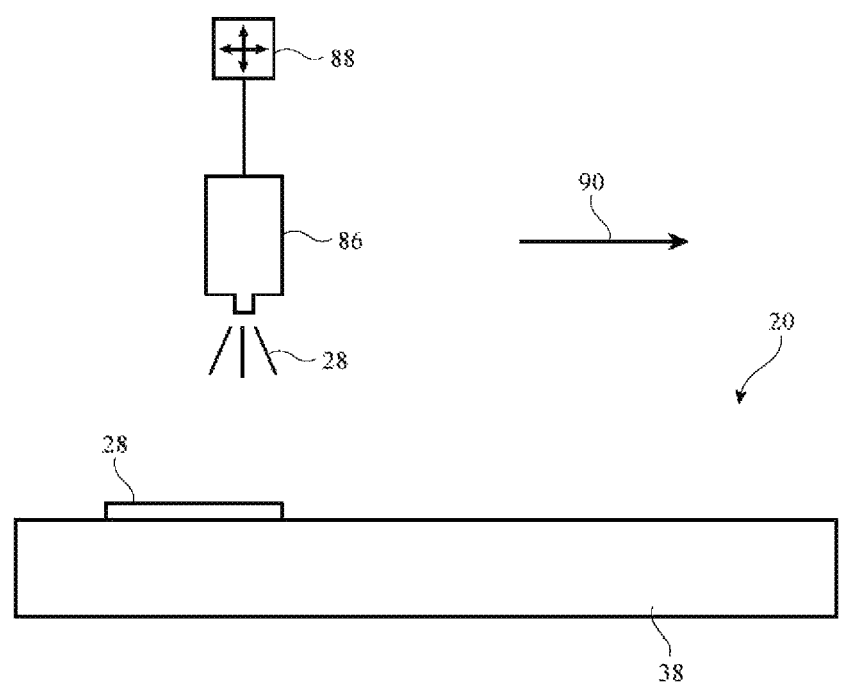
FIG. 6 is a side view of an illustrative piezoelectric component formed from printed piezoelectric ink in accordance with an embodiment.

Piezoelectric material 28 in components 20 of device 10 may be formed from a piezoelectric fluid or ink that can be printed onto a substrate or other support surface. FIG. 6 is a diagram showing how piezoelectric ink 28 may be printed onto the surface of support 38. Support 38 may be a planar substrate, a curved substrate, a fabric substrate, an elastic diaphragm or other flexible substrate, or may be any other suitable support structure. Ink-jet dispenser 86 may be controlled using computer-controlled positioner 88. When moved in direction 90, dispenser 86 may deposit piezoelectric ink 28 onto support 38, thereby forming a desired shape and pattern of piezoelectric material 28 on support 38. Piezoelectric ink (e.g., binder material that contains piezoelectric particles) may be applied to a support structure using ink-jet printing, screen printing, pad printing, spraying, dipping, dripping, painting, or other suitable deposition techniques.

The example of FIG. 6 in which piezoelectric material 28 is deposited on support 38 is merely illustrative. Examples of other equipment that may be used to form or otherwise process piezoelectric material 28 include extrusion equipment, molding equipment (e.g., injection molding equipment, compression molding equipment, or other suitable molding equipment), physical vapor deposition equipment, chemical vapor deposition equipment, electrochemical deposition equipment (e.g., tools for electroless chemical deposition and/or electroplating), etching equipment, equipment for dispensing and curing liquid polymer (e.g., liquid polymer containing magnetic material), soldering equipment, cutting tools, machining equipment, equipment for forming welds, three-dimensional printing equipment (e.g., three-dimensional printing tools or other equipment that applies light or other energy to sinter, cure, ablate, and/or otherwise adjust the properties of material associated with a 3D printing process), etc.

Figure 7:
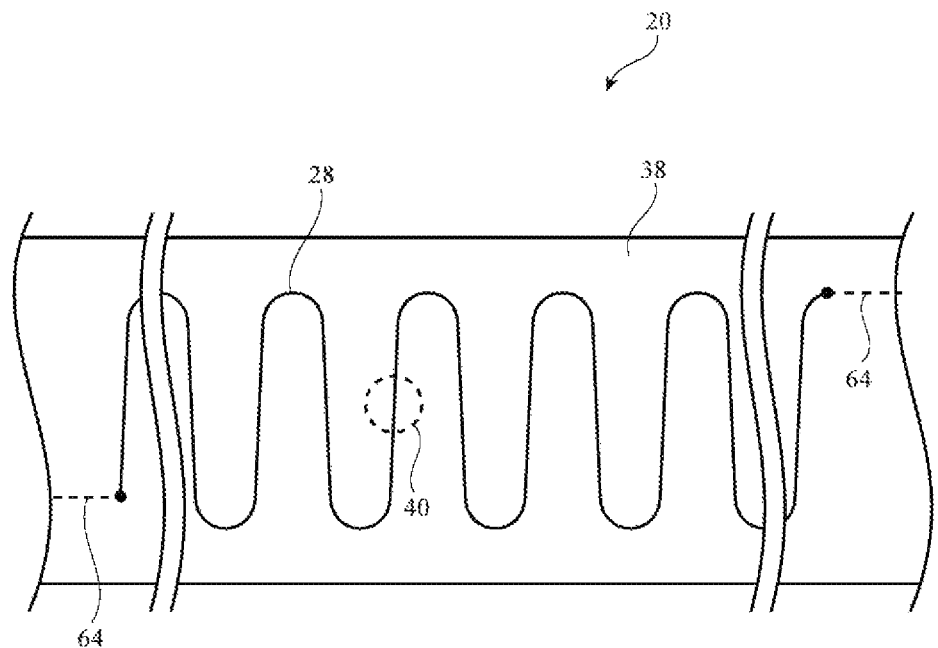
FIG. 7 is a top view of an illustrative piezoelectric component formed from a printed trace of piezoelectric ink on a substrate in accordance with an embodiment.

FIG. 7 is a top view of an illustrative piezoelectric component 20 having piezoelectric ink 28. Piezoelectric ink 28 (sometimes referred to as a fluid, a colloidal mixture, or paste) may be deposited on support 38 in any suitable pattern (e.g., using deposition equipment of the type shown in FIG. 6). In the example of FIG. 7, piezoelectric ink 28 has a serpentine pattern on surface 38. This is, however, merely illustrative. If desired, piezoelectric ink 28 may be formed in a spiral pattern, a zigzag pattern, a pattern of parallel lines, or any other suitable pattern. Ink 28 may be deposited to form one or more individual traces (as in the example of FIG. 7) or ink 28 may be deposited as a continuous layer covering a more substantial surface area on support 38. Ink 28 may be deposited over planar surfaces (e.g., may extend across a two-dimensional space) and/or may be deposited over surfaces with contours, curves, protrusions, recesses, steps, or other three-dimensional surface features.

Piezoelectric ink 28 may be coupled to conductive paths such as conductive signal paths 64. Conductive signal paths 64 may be metal traces on substrate 38 may be wires, may be flexible printed circuits, or may be other suitable conductive paths that convey electrical signals between piezoelectric ink 28 and control circuitry 12 (FIG. 1). Conductive paths 64 may be used to apply a voltage to piezoelectric ink 28 to cause piezoelectric ink 28 (and, if desired, support 38) to move and/or may be used to transmit electrical signals from piezoelectric ink 28 that are produced in response to a force applied to piezoelectric ink 28. If desired, electrodes may be located above and below ink 28 so that substrate 38 and ink 28 are sandwiched between first and second conductive layers. The conductive layers may be used to apply an electric field to ink 28 to produce mechanical energy and/or may be used to transmit electrical signals from ink 28 in response to a force applied to ink 28.

Figure 8:
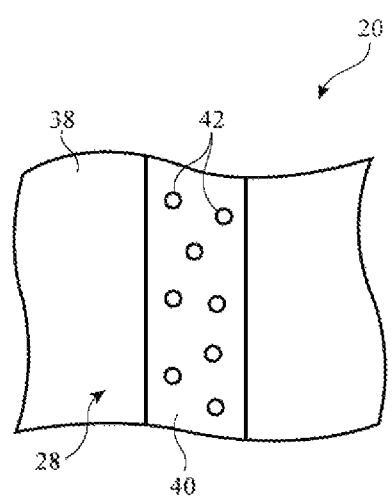
FIG. 8 is an enlarged view of a portion of the piezoelectric component of FIG. 7 in accordance with an embodiment.

FIG. 8 is an enlarged view of region 40 of FIG. 7 illustrating the composition of piezoelectric ink 28. As shown in FIG. 8, piezoelectric ink 28 may include piezoelectric particles 42. Examples of materials that may be used to form piezoelectric particles 42 include synthetic ceramics such as lead zirconate titanate (PZT), naturally occurring crystals such as quartz, synthetic crystals such as langasite, polymer-based piezoelectric materials such as Polyvinylidene fluoride, lead-free piezoceramics such as sodium potassium niobate, piezoelectric nanotubes such as boron-nitride nanotubes or composite carbon nanotubes, other suitable piezoelectric materials, or a combination of any two or more of these materials. A binder such as binder 40 (sometimes referred to as a matrix or supporting material) may be used to support piezoelectric particles 42 (i.e., piezoelectric particles 42 may be embedded within binder 40). Examples of materials that may be used to form binder 40 include metal oxides and polymers such as silicones, polyamides (e.g., nylon 6, nylon 12, etc.), polyphenylene sulfide (PPS), and other suitable polymers. Other materials may be used, if desired.

Figure 9:
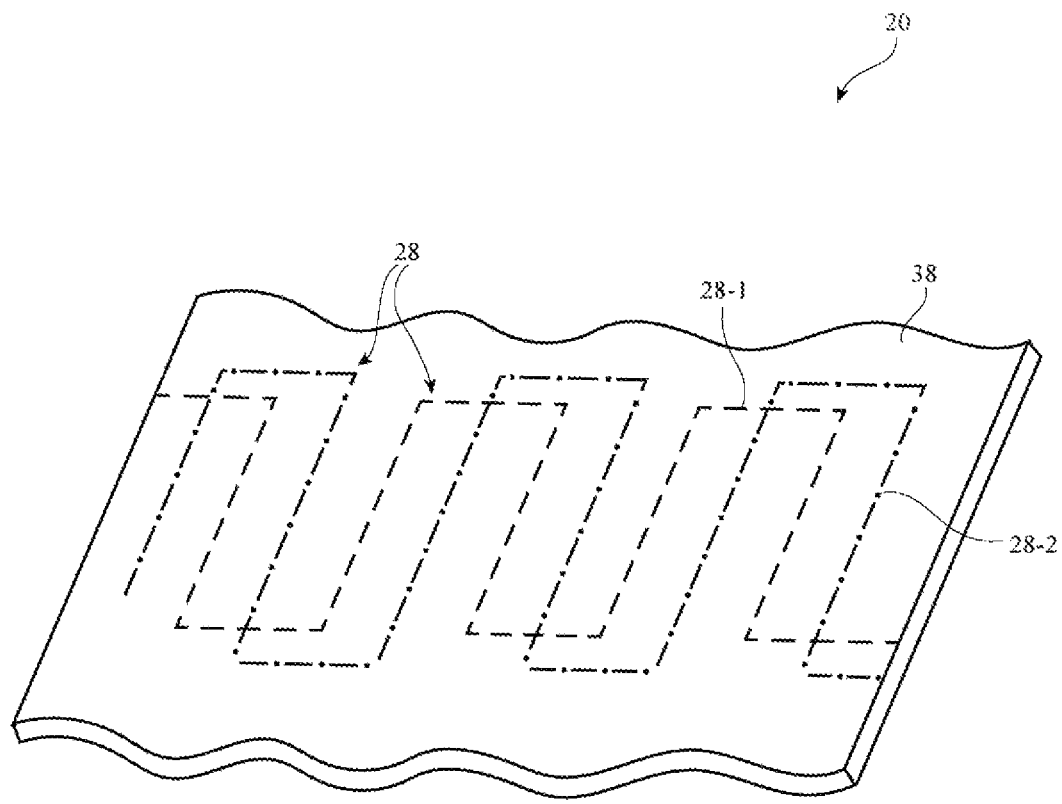
FIG. 9 is a perspective view of an illustrative piezoelectric component having piezoelectric ink traces that form a motor in accordance with an embodiment.

FIG. 9 shows an illustrative piezoelectric component 20 in which piezoelectric ink 28 forms multiple traces on support 38 such as piezoelectric ink trace 28-1 and piezoelectric ink trace 28-2. If desired, piezoelectric ink traces 28-1 and 28-2 may have different properties. For example, traces 28-1 and 28-2 may have different patterns, may have different thicknesses, may have piezoelectric particles 42 formed from different materials, in different concentrations, in different shapes, etc., and/or may be driven at different voltages or frequencies.

Piezoelectric component 20 may be used to form an ultrasonic motor. For example, control circuitry 12 may apply a voltage to piezoelectric traces 28-1 and 28-2, causing traces 28-1 and 28-2 to vibrate. The voltage applied to trace 28-1 may correspond to a first waveform (e.g., a cosine wave) and the voltage applied to trace 28-2 may correspond to a second waveform that is 90 degrees out of phase with the first waveform (e.g., a sine wave). This may cause traces 28-1 and 28-2 to vibrate out of phase with one another so that a surface wave is formed. In arrangements where component 20 forms part of an ultrasonic motor (e.g., a rotational ultrasonic motor or linear ultrasonic motor), the surface waves produced may have a frequency in the ultrasonic range.

Figure 10:
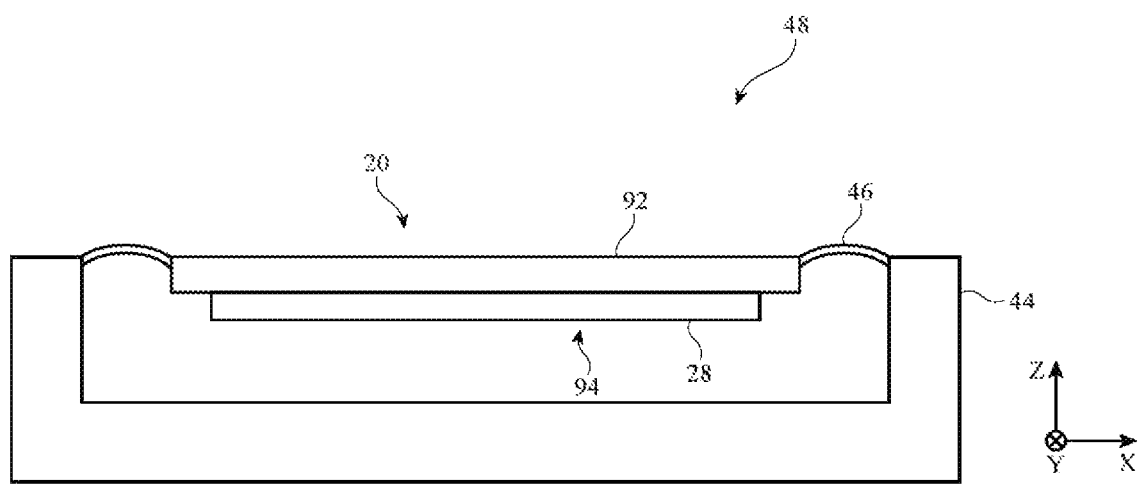
FIG. 10 is a cross-sectional side view of an illustrative speaker having a piezoelectric component in accordance with an embodiment.

FIG. 10 illustrates an arrangement in which piezoelectric component 20 forms part of an audio component such as a speaker. As shown in FIG. 10, speaker 48 may include a diaphragm such as flexible diaphragm 92 and a transducer 94 formed from piezoelectric ink 28. Transducer 94 may receive electrical audio signal input from circuitry in device 10, which in turn causes piezoelectric material 28 in transducer 94 to vibrate. The vibration of transducer 94 causes diaphragm 92 to vibrate at the same frequency, thereby producing audible sound.

Diaphragm 92 may be formed from a flexible material (e.g., a flexible polymer layer or other suitable flexible layer). Piezoelectric material 28 (e.g., an ink of the type described in connection with FIG. 8) may be deposited directly on diaphragm 92 or may be deposited on a separate substrate that is then attached (e.g., via adhesive or other attachment mechanism) to diaphragm 92.

A suspension structure such as suspension structure 46 may be used to attach portions of diaphragm 92 to a rigid support structure such as support structure 44. Suspension structure 46 may help prevent speaker membrane 92 from moving laterally along the x-axis and/or the y-axis, but may allow free motion of speaker membrane 92 along the z-axis as speaker 48 produces sound. Suspension structure 46 may be formed from an elastomeric material, foam material, resin coated material, other suitable materials, or a combination of these materials. As shown in the example of FIG. 10, suspension structure 46 may form a pliant interface between speaker membrane 92 and support structure 44.

Figure 11:
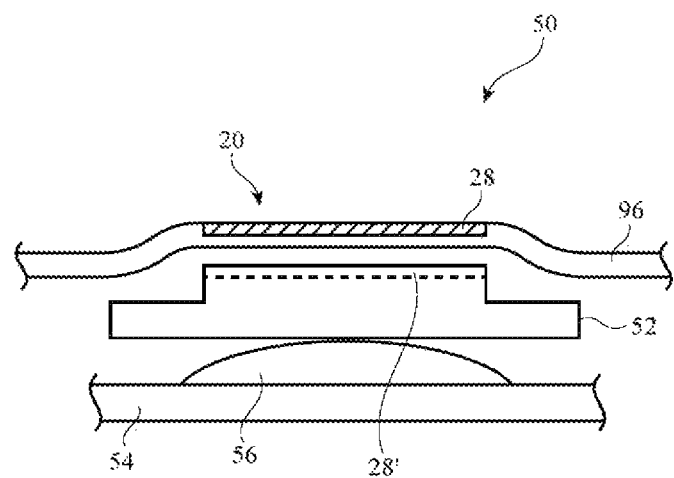
FIG. 11 is a cross-sectional side view of an illustrative key having a piezoelectric component that overlaps a movable key member in accordance with an embodiment.

If desired, piezoelectric ink 28 may be used in other types of input-output devices 14 in device 10 such as buttons (e.g., keys in a keyboard or stand-alone buttons). An illustrative key formed from a movable key member (e.g., a keyboard key or other button) is shown in FIG. 11. As shown in FIG. 11, key 50 may have movable key member 52 and flexible layer such as flexible outer layer 96 that overlaps key member 52. Layer 96 may be a fabric layer, a flexible polymer layer, a layer of silicone, or other flexible member that forms an outer layer of key 50 in device 10. Arrangements where layer 96 is a fabric layer are sometimes described herein as an illustrative example. Key 50 may include one or more piezoelectric components such as piezoelectric component 20. Piezoelectric component 20 may include piezoelectric ink 28 formed on layer 96, as shown in the example of FIG. 11. If desired, piezoelectric ink 28 may be formed on key member 52 instead of or in addition to being formed on layer 96 (e.g., piezoelectric material may be deposited on the surface of key member 52, as indicated by material 28' of FIG. 11).

Keys such as key (button) 50 may include dome switches or other mechanically actuated input devices, as illustrated by dome switch 56 on substrate 54 in FIG. 11. In configurations in which key 50 includes a switch such as switch 56, a user may press downwards on button 50 during a key press event. This moves button member 52 downwards and compresses dome switch 56. Control circuitry 12 can monitor the state of dome switch 56 to detect key press events. Dome switch support structure 54 may be formed from a plastic support structure, a housing structure, a substrate such as a printed circuit having traces that route switch signals to control circuitry 12, or other suitable support for dome switches such as dome switch 56. If desired, dome switches and other mechanical switches may be omitted from keys such as key 50 and a user's input may be gathered using exclusively touch sensor input from a touch sensor in layer 96 and/or input from piezoelectric components 20. Keys such as key 50 may be formed on any portion of device 10 that is accessible by a user's finger (e.g., the surface of a watch band, the surface of a keyboard, an exterior or interior portion of an item of clothing or bag, a surface of a console, the surface of a seat, the surface of an item of furniture, etc.).

Piezoelectric components in device 10 such as piezoelectric component 20 may be used for sensing (e.g., receiving input) and/or for actuation (e.g., providing output). For example, piezoelectric component 20 may be used to detect a force applied to fabric 96 over button 50 and/or may be used to provide haptic output in response to a user contacting or pressing button 50.

During operation, a user may press on key 50 with the user's fingers. Dome switch 56 in each key 50, piezoelectric component 20, a touch sensor formed in fabric 96, and/or other suitable input components associated with key 50 may be used to gather key press data. In response to detected key presses and/or in response to satisfaction of other criteria, control circuitry 12 may activate piezoelectric component 20 to provide haptic output. For example, a piezoelectric device 20 that overlaps a pressed key may be activated to provide a user with haptic feedback indicating that the key has been successfully pressed.

Figure 12:
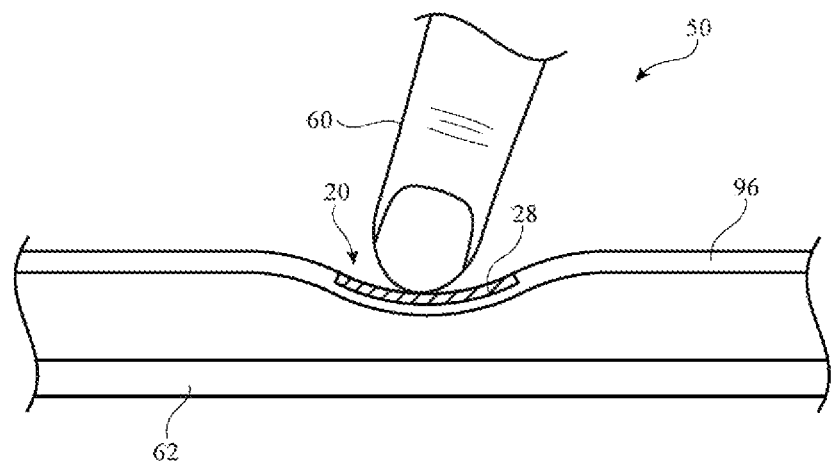
FIG. 12 is a cross-sectional side view of an illustrative key having a piezoelectric component that detects key presses and/or that provides haptic output in accordance with an embodiment.

FIG. 12 is a cross-sectional side view of an example in which key 50 is formed without a moveable button member. With this type of arrangement, key press data may be gathered by piezoelectric component 20 in layer 96, by a touch sensor formed in (or overlapping with) layer 96, and/or by other suitable input components associated with key 50. In response to detected key presses and/or in response to satisfaction of other criteria, control circuitry 12 may activate piezoelectric component 20 to provide haptic output. For example, a piezoelectric device 20 that overlaps a pressed key may be activated to provide a user with haptic feedback indicating that the key has been successfully pressed. If desired, layer 96 may be sufficiently flexible that it bends towards lower housing structure 62 when pressed by a user's finger 60, as shown in the example of FIG. 12, or layer 96 may be stiff so that it does not bend when pressed by a user's finger.

Figure 13:
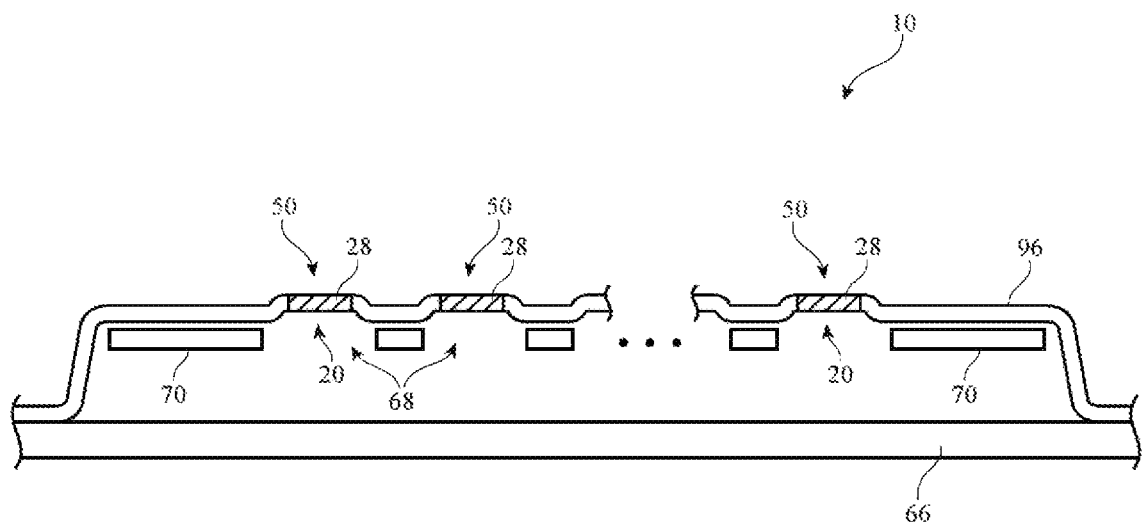
FIG. 13 is a cross-sectional side view of an illustrative keyboard having an array of keys with piezoelectric components in accordance with an embodiment.

FIG. 13 is a cross-sectional side view of an illustrative electronic device having an array of keys 50. In the example of FIG. 13, device 10 is a cover (or part of a cover) for a tablet computer or other electronic equipment. Device 10 may have housing structures formed from plastic, metal, glass, ceramic, carbon-fiber composites, fiberglass, and other fiber composites, fabric and other intertwined strands of material, and/or other materials. As an example, device 10 may have components that are mounted within a housing body formed from lower housing layer 66 and upper housing layer 96. Lower housing layer 66 may be formed from plastic, plastic with embedded microfibers, or other materials. Upper housing layer 96 may be formed from fabric.

Device 10 may include a keyboard (e.g., a computer keyboard for an associated tablet computer, laptop computer, or other computing equipment). The keyboard may have an array of keys 50 that are formed in or covered by fabric layer 26. Each key 50 may have a movable button member (e.g., of the type shown in FIG. 11) or keys 50 may be free of movable button members, as shown in the example of FIG. 13. Fabric layer 96 may be supported by a support structure such as key web 70 (e.g., a plastic panel with rectangular openings 68 that overlap keys 50). Key web 70 may supply structural support for fabric layer 96 and may therefore form an internal frame for the upper housing wall of device 10. Each key 50 may include a piezoelectric element such as piezoelectric component 20 for gathering key press data and/or for providing haptic output.

During operation, a user may press on key 50 with the user's fingers. Piezoelectric component 20, a touch sensor formed in fabric 96, and/or other suitable input components associated with key 50 may be used to gather key press data. In response to detected key presses and/or in response to satisfaction of other criteria, control circuitry 12 may activate piezoelectric component 20 to provide haptic output. For example, a piezoelectric device 20 that overlaps a pressed key may be activated to provide a user with haptic feedback indicating that the key has been successfully pressed.

Figure 14:
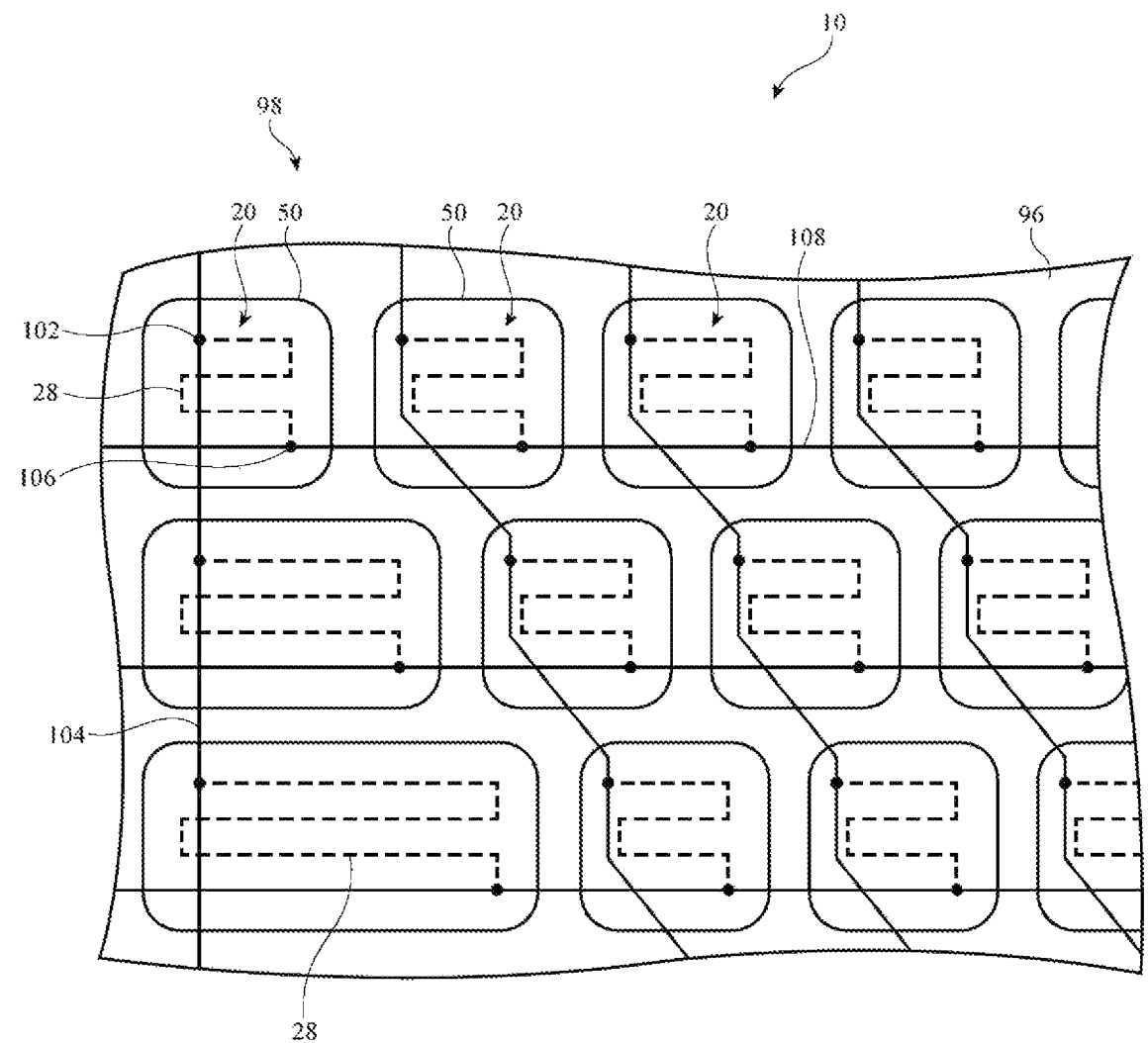
FIG. 14 is a top view of an illustrative keyboard having an array of piezoelectric components that produce haptic output and/or receive user input in accordance with an embodiment.

FIG. 14 is a top view of a portion of an illustrative electronic device 10 have an array of keys with piezoelectric components. As shown in FIG. 14, each key 50 (e.g., a key of the type shown in FIG. 11, 12, or 13) of keyboard 98 has an associated piezoelectric component 20. Keys 50 may each include an embossed key-shaped region of fabric 96. If desired, fabric 96 may incorporate a touch sensor. For example, fabric 96 may include insulating strands (e.g., warp strands 76 and weft strands 78 of FIG. 3) interspersed with conductive strands that form horizontal drive lines and vertical sense lines.

Piezoelectric elements 20 may each be formed from a trace or layer of piezoelectric material 28 (e.g., a piezoelectric ink of the type described in connection with FIG. 8). Each segment of piezoelectric material 28 may have a first terminal 102 coupled to a vertical line 104 and a second terminal 106 coupled to a horizontal line 108 (e.g., using solder, welds, conductive adhesive, or other connections). Horizontal lines 108 and vertical lines 104 may be formed from metal traces on fabric 96, metal traces on a printed circuit, conductive strands in fabric 96, or conductive paths formed on any other suitable substrate and may be used as address lines for piezoelectric components 20 formed from respective piezoelectric material segments 28.

Whenever a particular piezoelectric component 20 is to be activated, an electric field may be applied to material 28 of that piezoelectric component 20 by control circuitry 12 by applying a voltage across an appropriate set of lines (e.g., the horizontal line 108 coupled to the terminal 106 of that segment and a vertical line 104 coupled to the terminal 102 of that segment), resulting in haptic output from that piezoelectric component 20. In arrangements where piezoelectric components 20 are used for sensing, mechanical input on piezoelectric components 20 (e.g., an applied force or touch from a user's finger) may result in a potential difference across terminals 102 and 106 that is conveyed to control circuitry 12 and processed as key press data.

The foregoing is merely illustrative and various modifications can be made to the described embodiments. The foregoing embodiments may be implemented individually or in any combination.

What is claimed is:

1. An electronic device, comprising:
    a substrate;
    a piezoelectric trace on the substrate, wherein the piezoelectric trace comprises piezoelectric particles dispersed in a binder;
    control circuitry; and
    a conductive signal path that conveys signals between the piezoelectric trace and the control circuitry.

2. The electronic device defined in claim 1 wherein the piezoelectric trace has a serpentine shape.

3. The electronic device defined in claim 1 further comprising an additional piezoelectric trace on the substrate, wherein the control circuitry supplies control signals to the piezoelectric trace and the additional piezoelectric trace to cause the piezoelectric trace and the additional piezoelectric trace to vibrate.

4. The electronic device defined in claim 3 wherein the control signal supplied to the piezoelectric trace has a first waveform and the control signal applied to additional piezoelectric trace has a second waveform, and wherein the second waveform is 90 degrees out of phase with the first waveform such that vibration of the piezoelectric trace and the additional piezoelectric trace forms a surface wave.

5. The electronic device defined in claim 4 wherein the surface wave has a frequency in the ultrasonic range.

6. The electronic device defined in claim 1 wherein the substrate comprises a speaker diaphragm.

7. The electronic device defined in claim 1 wherein the substrate comprises a fabric layer.

8. The electronic device defined in claim 1 further comprising a movable key member, wherein the piezoelectric trace overlaps the movable key member.

9. The electronic device defined in claim 1 further comprising an array of keys and wherein the piezoelectric trace overlaps one of the keys.

10. The electronic device defined in claim 9 wherein the control circuitry applies a voltage to the piezoelectric trace to provide haptic output.

11. The electronic device defined in claim 9 wherein the control circuitry gathers key press data from the piezoelectric trace.

12. The electronic device defined in claim 1 wherein the piezoelectric particles comprise lead zirconate titanate.

13. The electronic device defined in claim 1 wherein the binder comprises material selected from the group consisting of: silicone and metal oxide.

14. A keyboard, comprising:
    an array of keys;
    piezoelectric ink traces that each overlap a respective one of the keys;
    control circuitry; and
    a grid of signal lines coupled to the piezoelectric ink traces, wherein the grid of signal lines conveys signals between the piezoelectric ink traces and the control circuitry.

15. The keyboard defined in claim 14 wherein the grid of signal lines comprises horizontal signal lines and vertical signal lines, wherein each piezoelectric ink trace comprises first and second opposing ends coupled respectively to first and second terminals, wherein the first terminal is coupled to one of the vertical signal lines and the second terminal is coupled to one of the horizontal signal lines.

16. The keyboard defined in claim 14 wherein each key comprises a movable key member.

17. The keyboard defined in claim 14 further comprising a fabric layer, wherein the piezoelectric traces are formed on the fabric layer.

18. Apparatus, comprising:
    a flexible substrate;
    piezoelectric material on the flexible substrate, wherein the piezoelectric material comprises piezoelectric particles dispersed in a binder; and
    control circuitry that supplies haptic output by applying a voltage to the piezoelectric material.

19. The apparatus defined in claim 18 wherein the control circuitry gathers touch input using the piezoelectric material.

20. The apparatus defined in claim 18 wherein the piezoelectric material has a serpentine shape.

* * * * *